United States Patent
Schulze et al.

(10) Patent No.: US 8,946,850 B2
(45) Date of Patent: Feb. 3, 2015

(54) INTEGRATED CIRCUIT INCLUDING A POWER TRANSISTOR AND AN AUXILIARY TRANSISTOR

(75) Inventors: Hans-Joachim Schulze, Taufkirchen (DE); Anton Mauder, Kolbermoor (DE); Frank Pfirsch, Munich (DE)

(73) Assignee: Infineon Technologies Austria AG, Villach (AT)

( * ) Notice: Subject to any disclaimer, the term of this patent is extended or adjusted under 35 U.S.C. 154(b) by 119 days.

(21) Appl. No.: 13/312,180

(22) Filed: Dec. 6, 2011

(65) Prior Publication Data

US 2013/0140616 A1 Jun. 6, 2013

(51) Int. Cl.
*H01L 31/058* (2006.01)

(52) U.S. Cl.
USPC ......................................... 257/467

(58) Field of Classification Search
USPC ................................. 257/467–470
See application file for complete search history.

(56) References Cited

U.S. PATENT DOCUMENTS

| 7,436,023 | B2 | 10/2008 | Hirler et al. |
| 7,795,660 | B2 | 9/2010 | Mauder et al. |
| 2010/0309710 | A1* | 12/2010 | Evans, Jr. ...................... 365/145 |
| 2011/0049593 | A1 | 3/2011 | Schulze et al. |
| 2011/0198725 | A1* | 8/2011 | Roest et al. .................... 257/532 |

FOREIGN PATENT DOCUMENTS

| DE | 102004007197 A1 | 9/2005 |
| DE | 102004044619 A1 | 3/2006 |
| DE | 102009038710 A1 | 4/2011 |

* cited by examiner

*Primary Examiner* — Matthew Reames

(74) *Attorney, Agent, or Firm* — Murphy, Bilak & Homiller, PLLC

(57) ABSTRACT

In one embodiment of an integrated circuit, the integrated circuit includes a power transistor with a power control terminal, a first power load terminal and a second power load terminal. The integrated circuit further includes an auxiliary transistor with an auxiliary control terminal, a first auxiliary load terminal and a second auxiliary load terminal. The first auxiliary load terminal is electrically coupled to the power control terminal. The integrated circuit further includes a capacitor with a first capacitor electrode, a second capacitor electrode and a capacitor dielectric layer. The capacitor dielectric layer includes at least one of a ferroelectric material and a paraelectric material. The first capacitor electrode is electrically coupled to the auxiliary control terminal.

23 Claims, 3 Drawing Sheets

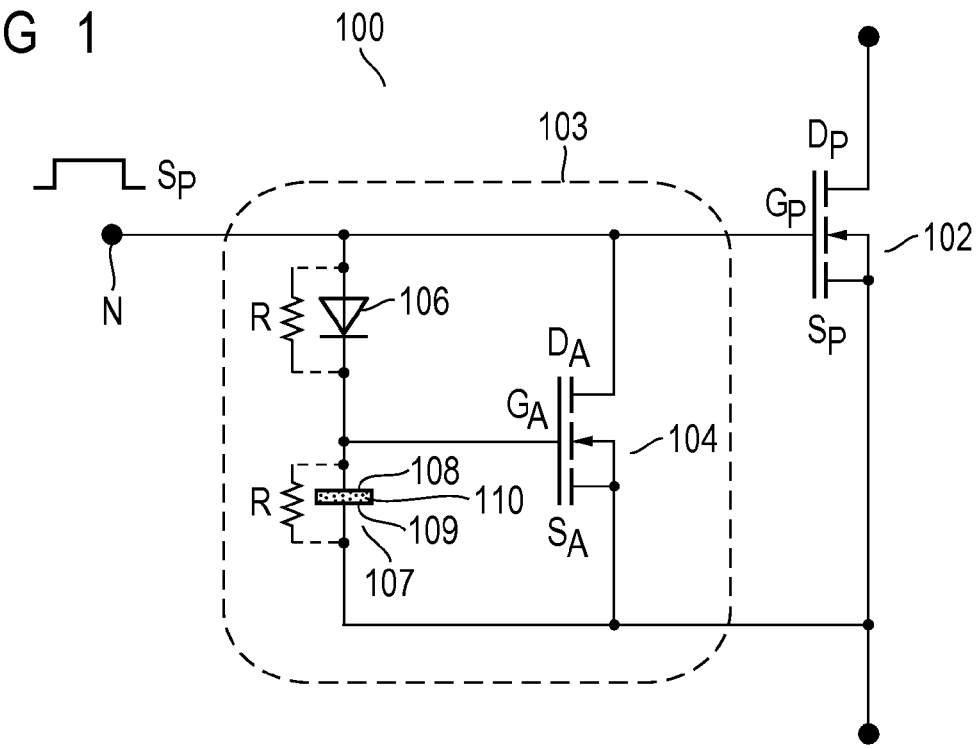
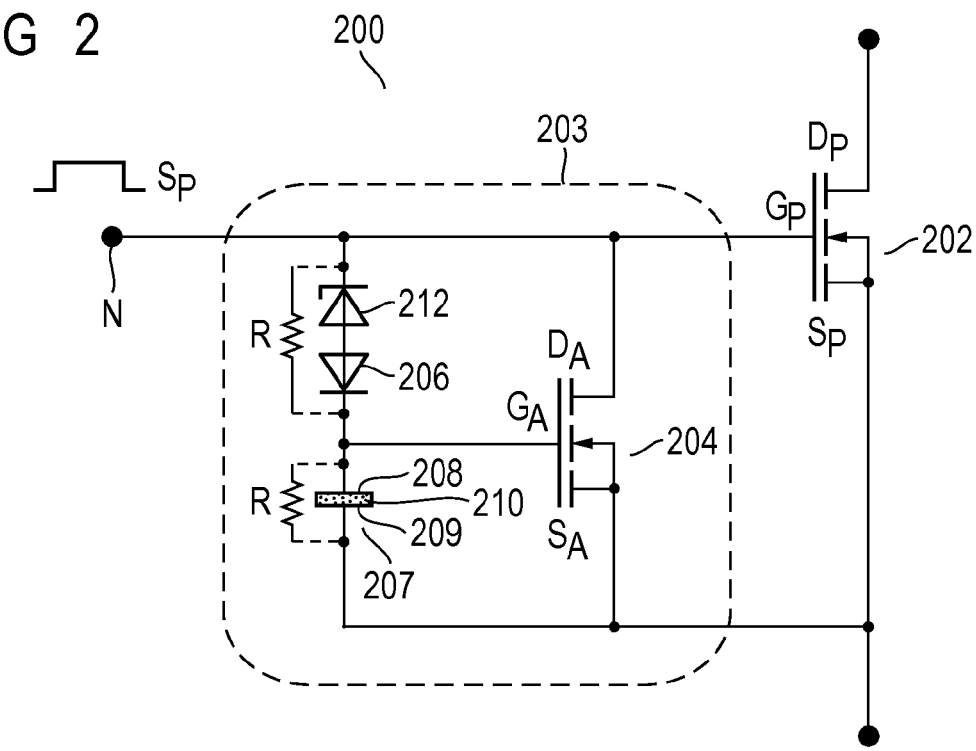

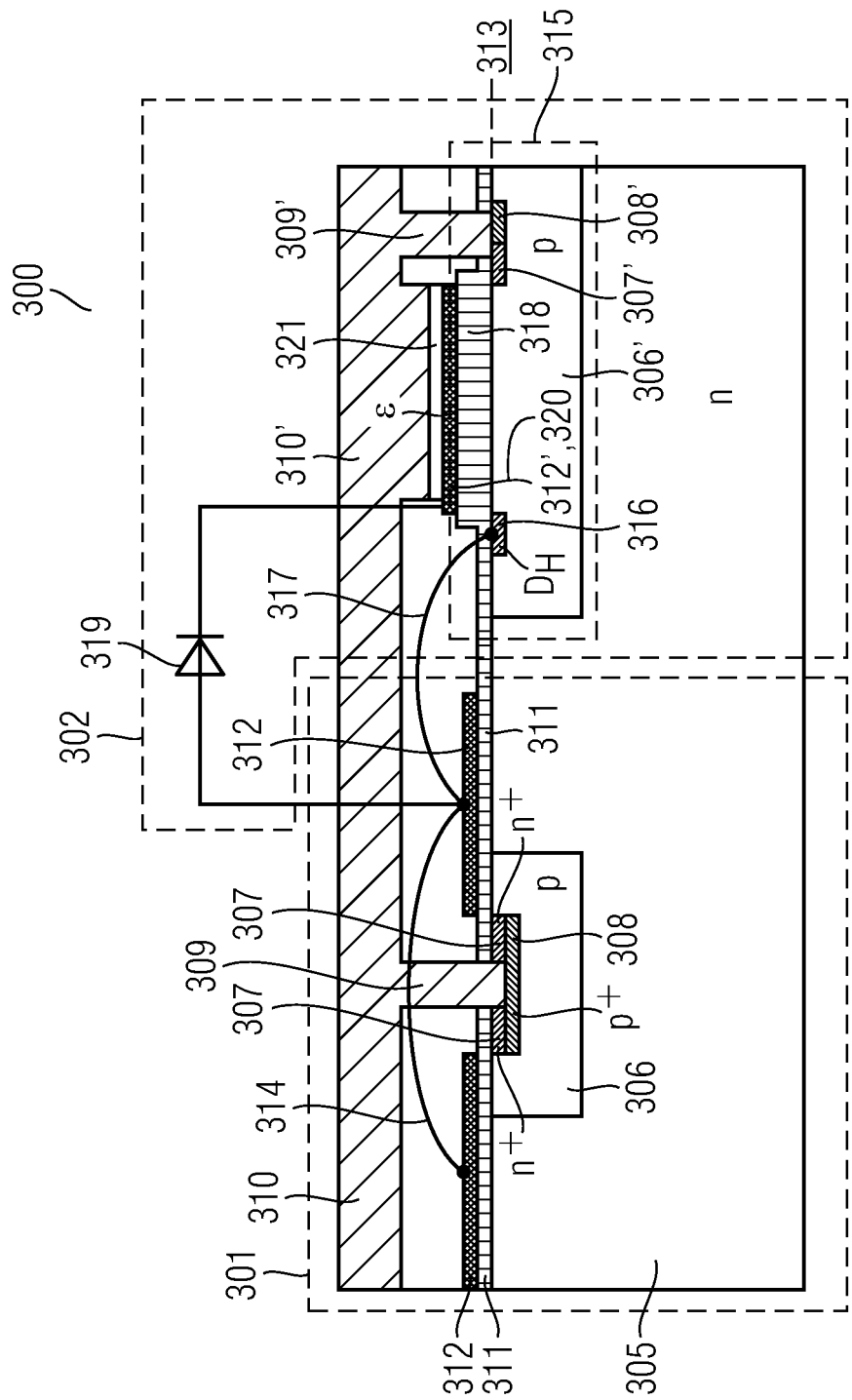

INTEGRATED CIRCUIT INCLUDING A POWER TRANSISTOR AND AN AUXILIARY TRANSISTOR

BACKGROUND

During operation, semiconductor components such as switches in power supplies and power converters are heated due to power dissipation within these components.

If semiconductor components are operated below the so-called stable-temperature point, current filamentation may occur and lead to a destruction of the semiconductor components.

As a counter measure to excessive heating and current filamentation, electrical parameters such as forward current, dI/dt, dU/dt, temperature etc. are generally limited appropriately and kept within a safe operation area range (SOA range) during operation. Limitation of the operation range to a safe operation area, however, restricts further improvements of the characteristics of the semiconductor components.

Thus, it is desirable to improve protection of semiconductor components against excessive heating and current filamentation.

SUMMARY

According to one embodiment of an integrated circuit, the integrated circuit includes a power transistor with a power control terminal, a first power load terminal and a second power load terminal. The integrated circuit further includes an auxiliary transistor with an auxiliary control terminal, a first auxiliary load terminal and a second auxiliary load terminal. The first auxiliary load terminal is electrically coupled to the power control terminal. The integrated circuit further includes a capacitor with a first capacitor electrode, a second capacitor electrode and a capacitor dielectric layer. The capacitor dielectric layer includes at least one of a ferroelectric material and a paraelectric material. The first capacitor electrode is electrically coupled to the auxiliary control terminal.

Those skilled in the art will recognize additional features and advantages upon reading the following detailed description, and on viewing the accompanying drawings.

BRIEF DESCRIPTION OF THE DRAWINGS

The accompanying drawings are included to provide a further understanding of the present invention and are incorporated in and constitute a part of this specification. The drawings illustrate embodiments of the present invention and together with the description serve to explain principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts. The features of the various illustrated embodiments can be combined unless they exclude each other.

Embodiments are depicted in the drawings and are detailed in the description which follows.

FIG. 1 is a schematic illustration of a part of an integrated circuit including a power transistor with a power control terminal that is electrically coupled to a protection circuit including a diode and a capacitor.

FIG. 2 is a schematic illustration of a part of an integrated circuit including a power transistor with a power control terminal that is electrically coupled to a protection circuit including two diodes and a capacitor.

FIG. 3 is a schematic illustration of a vertical cross section through a part of a power transistor cell array including an auxiliary transistor and a capacitor electrically coupled to an auxiliary control terminal of the auxiliary transistor.

DETAILED DESCRIPTION

Figure 4:
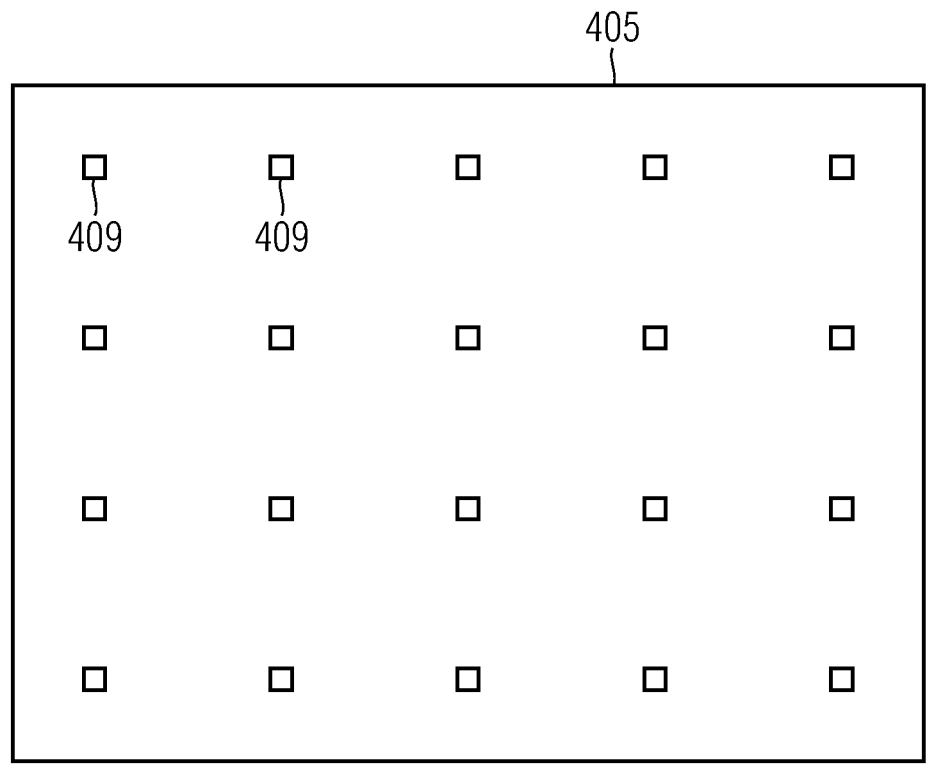
FIG. 4 is a schematic top view of one layout of a power transistor cell array and a protection circuit having protection circuit parts spread evenly over the power transistor cell array.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", "over", "above", "below", etc., is used with reference to the orientation of the Figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing processes have been designated by the same references in the different drawings if not stated otherwise.

The terms "lateral" and "horizontal" as used in this specification intends to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

As employed in this specification, the terms "coupled" and/or "electrically coupled" are not meant to mean that the elements must be directly coupled together—intervening elements may be provided between the "coupled" or "electrically coupled" elements. The term "electrically connected" intends to de-scribe a low-ohmic electric connection between the elements electrically connected together, e.g. a connection via a metal and/or highly doped semiconductor.

In this specification, n-doped may refer to a first conductivity type while p-doped is referred to a second conductivity type. It goes without saying that the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "n$^-$" means a doping concentration which is less than the doping concentration of an "n"-doping region while an "n$^+$"-doping region has a larger doping concentration than the "n"-doping region. Indicating the relative doping concentration does not, however, mean that doping regions of the same relative doping concentration have the same absolute doping concentration unless otherwise stated. For example, two different n+-doped regions can have different absolute doping concentrations. The same applies, for example, to an n+-doped and a p+-doped region.

Specific embodiments described in this specification pertain to, without being limited thereto, power semiconductor devices which are controlled by field-effect and particularly to unipolar devices such as MOSFETs.

The term "field-effect" as used in this specification intends to describe the electric field mediated formation of an "inversion channel" and/or control of conductivity and/or shape of the inversion channel in a semiconductor channel region.

In the context of the present specification, the term "field-effect structure" intends to describe a structure which is formed in a semiconductor substrate or semiconductor body or semiconductor device and has a gate electrode which is insulated at least from the body region by a dielectric region or dielectric layer. Examples of dielectric materials for forming a dielectric region or dielectric layer between the gate electrode and the body region include, without being limited thereto, silicon oxide ($SiO_2$), silicon nitride ($Si_3N_4$), silicon oxinitride ($SiO_xN_y$), zirconium oxide ($ZrO_2$), tantalum oxide ($Ta_2O_5$), titanium oxide ($TiO_2$) and hafnium oxide ($HfO_2$) or stacks of these materials.

Above a threshold voltage $V_{th}$ between the gate electrode and the source electrode connected typically to the body region, an inversion channel is formed and/or controlled due to the field-effect in a channel region of the body region adjoining the dielectric region or dielectric layer. The threshold voltage $V_{th}$ typically refers to the minimum gate voltage necessary for the onset of a unipolar current flow between the two semiconductor regions of the first conductivity type, which form the source and the drain of a transistor.

In the context of the present specification, the term "MOS" (metal-oxide-semiconductor) should be understood as including the more general term "MIS" (metal-insulator-semiconductor). For example, the term MOSFET (metal-oxide-semiconductor field-effect transistor) should be understood to include FETs having a gate insulator that is not an oxide or a gate material that is not a metal, i.e., the term MOSFET is used in the more general term meaning IGFET (insulated-gate field-effect transistor) and MISFET, respectively.

Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

FIG. 1 illustrates a part of a circuit diagram of an integrated circuit 100 according to an embodiment. The integrated circuit 100 includes an n-type MOSFET (NMOS) 102. The NMOS 102 includes a drain terminal $D_P$ as a first load terminal, a source terminal $S_P$ as a second load terminal and a gate terminal $G_P$ as a power control terminal.

The integrated circuit 100 further includes an auxiliary NMOS 104. A drain terminal $D_A$ of the auxiliary NMOS 104 constituting a first load terminal is electrically connected to the gate terminal $G_P$ of the power NMOS 102. A source terminal $S_A$ constituting a second load terminal of the auxiliary NMOS 104 is electrically connected to the source terminal $S_P$ of the power transistor 102.

A serial connection of a diode 106 and a capacitor 107 is connected in parallel with the drain and source terminals $D_A$, $S_A$ of the auxiliary NMOS 104. An anode of the diode 106 is electrically connected to both the drain terminal $D_A$ of the auxiliary NMOS 104 and the gate terminal $G_P$ of the power NMOS 102. The capacitor 107 includes a first capacitor electrode 108 electrically connected to both a cathode of the diode 106 and a control terminal $G_A$ of the auxiliary NMOS 104, a second capacitor electrode 109 of the capacitor 107 is electrically connected to both the source terminal $S_A$ of the auxiliary NMOS 104 and the source terminal $S_P$ of the power NMOS 102. A capacitor dielectric layer 110 of the capacitor 107 includes at least one of a ferroelectric material and a paraelectric material. The capacitor dielectric layer 110 includes a relative dielectric constant $\in_r$ with a negative temperature coefficient. The capacitor dielectric layer 110 may include a ferroelectric material having a Curie point $T_C$ of less than 300 K. According to an embodiment, the relative dielectric constant $\in_r(T_1)$ of the capacitor dielectric layer 110 at a temperature $T_1=400$ K and the relative dielectric constant $\in_r(T_2)$ of the capacitor dielectric layer 110 at the temperature $T_2=475$ K satisfies $\in_r (T_2) \leq 0.75 \times \in_r(T_1)$. According to another embodiment, the capacitor dielectric layer 110 includes a paraelectric material or a ferroelectric material comprising at least one of $BaTiO_3$, $SrTiO_3$, $Ba_xSr_{1-x}TiO_3$ and $KTaO_3$.

During operation of the integrated circuit 100, a gate signal $S_P$ is supplied to the gate terminal $G_P$ of the power NMOS 102 via a node N. When the power NMOS 102 is turned on via the gate signal $S_P$, the capacitor 107 is charged via the diode 106. By adjusting a threshold voltage of the auxiliary NMOS 104 above the threshold voltage of the power NMOS 102, the gate signal $S_P$ turns on the power NMOS 102 while the auxiliary NMOS 104 remains turned off. The capacitor dielectric 110 may be thermally coupled to the power NMOS 102 by limiting a distance between the capacitor 107 and the transistor cell area of the power NMOS 102, e.g. by spreading sub capacitors of the capacitor 107 evenly over the cell area of the power NMOS 102.

When a temperature within the power NMOS 102 rises, e.g. due to a short circuit of the power NMOS 102, a temperature within the capacitor dielectric layer 110 also rises. Due to the negative temperature coefficient of the relative dielectric constant $\in_r$ of the capacitor dielectric layer 110, the value of capacitance of the capacitor 107 decreases. Since the diode 106 prevents a discharge of the capacitor 107 via the node N, a voltage drop cross the capacitor 107 increases. Hence, also the voltage drop between the gate terminal $G_A$ and the source terminal $S_A$ of the auxiliary NMOS 104 increases. When the voltage at the gate terminal $G_A$ of the auxiliary NMOS 104 exceeds the threshold voltage of the auxiliary NMOS 104, the auxiliary NMOS 104 is turned on leading to a short circuit between the gate terminal $G_P$ and the source terminal $S_P$ of the power NMOS 102. As a consequence, the power NMOS 102 is turned off.

Thus, a protection circuit 103 including elements 104, 106, 107 allows to turn off the power NMOS 102 by making use of the decrease of the relative dielectric constant $\in_r$ of the capacitor dielectric layer 110 when the temperature within the capacitor dielectric layer 110 increases due to heat diffusion from the power NMOS 102 thermally coupled to the capacitor 107. The power NMOS 102 may be turned off at a desired threshold temperature by appropriately adjusting parameters of the protection circuit 103 such as characteristics of the auxiliary transistor 104, e.g. threshold voltage, as well as characteristics of the capacitor 107, e.g. the relative dielectric constant $\in_r$.

According to one embodiment the threshold voltage of the auxiliary NMOS 104 exceeds the threshold voltage of the power NMOS 102 in a way, that at a typical operating gate voltage of the power NMOS 102 the leakage current of the auxiliary NMOS 104 is still low, which means that the threshold voltage of the auxiliary NMOS 104 is above the typical operating gate voltage of the power NMOS 102. Since typically the power NMOS 102 has a threshold voltage in the range of approximately 0.8V to approximately 8V and is operated with typical gate voltages in the range of about 3.3V to about 20V, the threshold voltages of the auxiliary NMOS 104 are above 3.3V up to 20V. The auxiliary NMOS 104 may have a threshold voltage that is typically more than 50% higher than that of the power NMOS 102.

According to one embodiment, a driver circuit supplying the gate signal $S_P$ to the gate terminal $G_P$ of the power NMOS 102 via the node N is configured to secure a time period Δt between a turning off of the power NMOS 102 due to the protection circuit 103 and a new turning on of the power NMOS 102. The time period Δt may be chosen appropriately to account for a hysteresis of the capacitor dielectric layer 110 by securing a sufficient cooling down of the power NMOS 102 and the capacitor dielectric layer 110.

According to one embodiment, a value of a dropping resistor $R_d$ of the gate terminal $G_P$ of the power NMOS 102 connected e.g. between terminal N in FIG. 1 and a driver circuit, i.e. a resistor used in series with the gate terminal $G_P$, is set in relation to the on-state resistance of the auxiliary NMOS 104 $R_{aux}$ according to:

$$R_d < R_{aux} \cdot \left( \frac{V_{driver}}{V_{th,NMOS}} - 1 \right) \quad \text{(eq. 1)}$$

where $V_{driver}$ gives the no-load output voltage of the driver circuit connected to terminal N via the dropping resistor and $V_{th,NMOS}$ relates to the threshold voltage of the power NMOS 102. By fulfilling equation 1 it is secured that the voltage at the gate $G_P$ of the power NMOS 102 is low enough to turn off the power NMOS 102 when the auxiliary NMOS 104 is in conducting mode.

FIG. 2 illustrates a part of a circuit diagram of an integrated circuit 200 according to another embodiment. Similar to circuit elements 102, 104, 106, 107 of the integrated circuit 100 illustrated in FIG. 1, the integrated circuit 200 includes a power NMOS 202 having a source terminal $S_P$, a drain terminal $D_P$ and a gate terminal $G_P$, an auxiliary NMOS 204 having a source terminal $S_A$, a drain terminal $D_A$ and a gate terminal $G_A$, a first diode 206 and a capacitor 207 including a first capacitor electrode 208, a second capacitor electrode 209 and a capacitor dielectric layer 210. The integrated circuit 200 differs from the integrated circuit 100 illustrated in FIG. 1 in that the protection circuit 203 further includes a second diode 212. The first diode 206 and the second diode 212 are antiserially connected diodes having their anodes interconnected. Thus, a cathode of the second diode 212 is electrically connected to both the drain terminal $D_A$ of the auxiliary NMOS 204 and the gate terminal $G_P$ of the power NMOS 202.

The second diode 212 is operated in a reserve breakdown mode when the power NMOS 202 is turned on via a respective gate signal $S_P$ supplied via node N. In this operation mode, a voltage at the gate terminal $G_A$ of the auxiliary NMOS 204 is smaller than the voltage at the gate terminal $G_P$ of the power NMOS 102 and a difference between these gate voltages equals the breakdown voltage of the second diode 212. Similar to the embodiment of the integrated circuit 100 illustrated in FIG. 1, also the protection circuit 203 turns the power NMOS 202 off in case that the temperature of the capacitor dielectric layer 210 exceeds a certain threshold temperature, or, in other words, the relative dielectric constant $\in_r$ of the capacitor dielectric layer 210 falls below a certain threshold value. Assuming that voltages supplied to the gate terminal $G_P$ of the power NMOS 202 in an on-state operation mode range within 10 V and 15 V, typical breakdown voltage of the second diode 212 range between 5 V and 8 V.

In the integrated circuit 200, the fractional amount of the gate signal $S_P$ supplied to the gate terminal $G_A$ of the auxiliary NMOS 204 is smaller than the respective fractional amount of the gate signal $S_P$ supplied to the gate terminal $G_A$ of the auxiliary NMOS 104 of the integrated circuit 100 illustrated in FIG. 1. The embodiment illustrated in FIG. 2 is beneficial since the auxiliary NMOS 204 and the power NMOS 202 may include equal or similar threshold voltages. Gate dielectrics of the auxiliary NMOS 204 and the power NMOS 202 may be manufactured in a common process or with similar requirements on reliability of the gate dielectrics.

High-ohmic resistors (R) may be connected in parallel to the diode(s) and/or the capacitor illustrated in FIGS. 1 and 2. This allows to e.g. drain off a leakage current of the second diode 212 to the source terminal SA of the auxiliary NMOS 204, for example and also hinders a gate charge at the gate terminal GA from being discharged too fast. Typical values for these resistors are above 1 kΩ more typically above 100 kΩ or above 1 MΩ. Such high-ohmic resistors (R) are shown connected with dashed lines in FIGS. 1 and 2 to indicate they are optional.

In the integrated circuits 100, 200 illustrated in FIGS. 1 and 2, the power transistor is illustrated as an NMOS. According to other embodiments, the power transistor may be any of a p-type or n-type channel field effect transistor such as a MOSFET or an IGBT (insulated gate bipolar transistor). Likewise, also the auxiliary transistor illustrated as an NMOS in FIGS. 1 and 2 may also be formed as any of an n-type or p-type field effect transistor such as a MOSFET.

According to another embodiment which is not illustrated in the Figures, the gate terminal $G_A$ of the auxiliary NMOS may be connected to another gate voltage, e.g. via a rectifying element. Using another drive voltage for the gate terminal $G_A$ of the auxiliary NMOS may be helpful since the same process steps may be used to manufacture the auxiliary NMOS and the power NMOS and maintain different gate voltages related to the threshold voltage of power NMOS and auxiliary NMOS which in this case can be chosen in the same range.

FIG. 3 illustrates a schematic cross-section through a part of an integrated circuit 300 according to an embodiment. The integrated circuit 300 includes a monolithic integration of a power transistor and a protection circuit including an auxiliary transistor, a capacitor and a diode. These circuit elements are interconnected as illustrated in the schematic circuit diagram of FIG. 1. A part of the cell area of the power transistor is illustrated in area 301 of FIG. 3 and a part of the protection circuit is illustrated in area 302 of FIG. 3.

The integrated circuit 300 includes an n-doped semiconductor body 305 such as an n-doped semiconductor substrate, e.g. a substrate made of silicon (Si) or silicon-on-insulator (SOI) or also made of a wide bandgap material like e.g. SiC or GaN. In the area 301, a part of a cell area of the power NMOS is illustrated. The power NMOS includes a p-doped body region 306 and $n^+$-doped source regions 307. A $p^+$-doped body contact zone 308 and a contact 309, e.g. a conductive plug or a conductive line, electrically couple the p-doped body region 306 to a conductive source layer 310, e.g. a source metallization. A gate dielectric 311 and a gate electrode 312 are arranged on a first side 313 of the n-doped semiconductor body 305. A short-circuit between the gate electrodes 312 of different transistor cells is illustrated in FIG. 3 in a simplified manner by a wire 314. The wire 314 may include one or a plurality of conductive layers or conductive lines formed by structuring one or a plurality of conductive layers in another part of the integrated circuit 300, i.e. in a part not illustrated in the cross-section of FIG. 3.

In the area 302 of the protection circuit, an auxiliary NMOS 315 includes a p-doped body region 306', $n^+$-doped source region 307' and a $p^+$-doped body contact zone 308'. The p-doped body region 306' is electrically coupled to the conductive source layer 310 via the $p^+$-doped body contact zone 308' and a contact 309'. Likewise, the source region 307' is electrically coupled to the conductive source layer 310 via the contact 309'. The auxiliary NMOS 315 further includes an $n^+$-doped drain region 316 that is electrically coupled to the gate 312 of the power NMOS. The electrical connection is illustrated in a simplified manner by a wire 317 that may include one or a plurality of conductive layers or conductive lines formed by structuring one or a plurality of conductive layers.

On the n-doped semiconductor body 305 at the first side 313, a gate dielectric 318 and a gate electrode 312' are arranged. A thickness of the gate dielectric 318 of the auxiliary NMOS 315 is larger than the thickness of the gate dielectric 311 of the power NMOS in the area 301 assuming that a material of the gate dielectrics 311, 318 is the same. According to other embodiments, the thickness of the gate dielectric 318 equals or is smaller than the thickness of the gate dielectric 311 provided that the threshold voltage of the auxiliary NMOS 315 is larger than the threshold voltage of the power NMOS, e.g. by choosing different materials for the dielectrics 311, 318 and/or by choosing an appropriate level of doping for the body region 306'. Thus, a threshold voltage of the auxiliary NMOS 315 is set higher than the threshold voltage of the power NMOS in the area 301. The gate electrode 312 of the power NMOS is electrically coupled to the gate electrode 312' of the auxiliary NMOS 315 via a diode which is illustrated in the cross-sectional view of FIG. 3 in a simplified manner by a diode symbol denoted by reference number 319.

The gate electrode 312' further constitutes a first capacitor electrode 320 of a capacitor further including a capacitor dielectric layer 321 and a second capacitor electrode 310' formed in the same layer as the conductive source layer 310.

The capacitor dielectric layer 321 may be formed as described with regard to the capacitor dielectric layer 110 illustrated in FIG. 1.

In the integrated circuit 300, the p-doped body regions 306, 306' may be simultaneously formed, for example. Likewise, the $n^+$-doped source regions 307, 307' and the $n^+$-doped drain region 316 may be simultaneously formed. Also the $p^+$-type body contact zones 308, 308' may be simultaneously formed. Also the gate electrodes 312, 312' may be simultaneously formed, for example. Hence, these elements, e.g. regions 306, 306', may be formed by patterning a same layer or a same layer stack. A drain contact of the power NMOS in an area 301 may be arranged at a rear side of the n-doped semiconductor body 305 opposite the first side 313, for example (not illustrated in FIG. 3).

FIG. 4 is a schematic illustration of a top view on one layout of an integrated circuit according to an embodiment. The integrated circuit includes a transistor cell area 405 of a power transistor such as power NMOS 102 illustrated in FIG. 1 or power NMOS 202 illustrated in FIG. 2.

Within the cell area 405, a capacitor including a plurality of sub capacitors 409 connected in parallel is arranged. The capacitor and the power NMOS may be monolithically integrated to form an integrated circuit as illustrated in any of FIGS. 1, 2 and 3 for example. The sub capacitors 409 are spread evenly over the cell area 405. The pattern of arrangement of the sub capacitors 409 illustrated in FIG. 4 is one example out of a vast variety of possibilities to evenly spread the sub capacitors 409 over the cell area 405.

Figure 5:
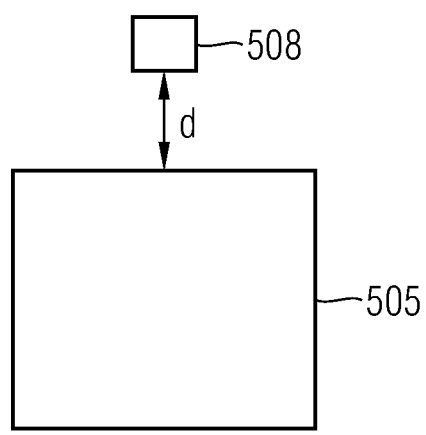
FIG. 5 is a schematic top view of one layout of a power transistor cell array and a protection circuit having a lateral distance to the power transistor cell array.

An alternative arrangement of the cell area 405 and the capacitor is illustrated in FIG. 5. Here, the capacitor is arranged in a capacitor area 508 having a lateral distance d to a cell area 505 of the power transistor. The power transistor in the cell area 505 has a maximum turn off time τ. The turn off time τ and the lateral distance d satisfy approximately $d<10^{-5}$ m/μs×τ. Thus, thermal coupling between the power transistor in the cell area 505 and the capacitor in the capacitor area 508 is achieved. In other words, when the temperature within the cell area 505 exceeds a certain threshold, thermal coupling between the cell area 505 and the capacitor area 508 leads to a decrease of the relative dielectric constant of the capacitor dielectric layer in the capacitor area 508. As described with regard to the embodiment illustrated in FIG. 1, this decrease in the relative dielectric constant is used to turn off the power transistor in the cell area 505.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit, comprising:
    a power transistor with a power control terminal, a first power load terminal and a second power load terminal;
    an auxiliary transistor with an auxiliary control terminal, a first auxiliary load terminal and a second auxiliary load terminal, wherein the first auxiliary load terminal is electrically coupled to the power control terminal; and
    a capacitor with a first capacitor electrode, a second capacitor electrode and a capacitor dielectric layer including at least one of a ferroelectric material and a paraelectric material,
    wherein the first capacitor electrode is electrically coupled to the auxiliary control terminal, and the second auxiliary load terminal, the second capacitor electrode and the second power load terminal are directly electrically connected.

2. The integrated circuit of claim 1, wherein the power transistor has at least one of an on-state resistance of 10Ω or below and a specified blocking voltage capability of 300 V or more.

3. The integrated circuit of claim 1, further comprising a semiconductor substrate including a monolithic integration of the power transistor and the capacitor.

4. The integrated circuit of claim 3, wherein:
    the power transistor includes a plurality of power transistor cells arranged in a cell area of the semiconductor substrate; and
    the capacitor is arranged in the cell area.

5. The integrated circuit of claim 4, wherein:
    the capacitor includes a plurality of sub capacitors connected in parallel; and the plurality of sub capacitors are spread evenly over the cell area.

6. The integrated circuit of claim 3, wherein:
the power transistor has a maximum turn off time τ and includes a plurality of power transistor cells arranged in a cell area of the semiconductor substrate;
the capacitor is arranged in a capacitor area having a lateral distance d to the cell area; and
the maximum turn off time τ and the lateral distance d satisfy $d < 10^{-5}$ m/μs×τ.

7. The integrated circuit of claim 1, further comprising:
a diode having an anode and a cathode; and wherein
the anode and the first auxiliary load terminal are electrically coupled to the power control terminal;
the cathode and the first capacitor electrode are electrically coupled to the auxiliary control terminal; and
the second capacitor electrode and the second auxiliary load terminal are electrically coupled to the second power load terminal.

8. The integrated circuit of claim 7, wherein:
the power transistor includes a power field effect transistor;
the auxiliary transistor includes an auxiliary field effect transistor; and
a threshold voltage of the auxiliary field effect transistor is larger than a threshold voltage of the power field effect transistor.

9. The integrated circuit of claim 8, wherein a thickness of a gate dielectric of the auxiliary field effect transistor is larger than the thickness of a gate dielectric of the power field effect transistor.

10. The integrated circuit of claim 7, wherein a resistor having a resistance value of more than $10^3 \Omega$ is connected in parallel to the diode.

11. The integrated circuit of claim 1, further comprising:
a first diode having a first anode and a first cathode;
a second diode having a second anode and a second cathode; and wherein
the second cathode and the first auxiliary load terminal are electrically coupled to the power control terminal;
the second anode is electrically coupled to the first anode;
the first cathode and the first capacitor electrode are electrically coupled to the auxiliary control terminal; and
the second capacitor electrode and the second auxiliary load terminal are electrically coupled to the second power load terminal.

12. The integrated circuit of claim 11, wherein:
the power transistor includes a power field effect transistor;
the auxiliary transistor includes an auxiliary field effect transistor; and
a threshold voltage $V_{th1}$ of the auxiliary field effect transistor is more than 50% higher than a threshold voltage $V_{th2}$ of the power field effect transistor.

13. The integrated circuit of claim 12, wherein a gate dielectric of the power field effect transistor and a gate dielectric of the auxiliary field effect transistor are part of a same patterned dielectric layer.

14. The integrated circuit of claim 11, wherein a reverse breakdown voltage of the second diode is in a range of 5 V to 8 V.

15. The integrated circuit of claim 11, wherein a resistor having a resistance value of more than $10^3 \Omega$ is connected in parallel to at least one of the first diode, the second diode and the capacitor.

16. The integrated circuit of claim 3, wherein:
the auxiliary control terminal is a gate electrode; and
the gate electrode and one of the capacitor first electrode and the capacitor second electrode are part of a same patterned conductive layer.

17. The integrated circuit of claim 1, wherein the power transistor includes one of a metal oxide field effect transistor and an insulated gate bipolar transistor.

18. The integrated circuit of claim 1, wherein the auxiliary transistor includes a field effect transistor.

19. The integrated circuit of claim 1, wherein a temperature coefficient of the capacitor dielectric layer is negative.

20. The integrated circuit of claim 1, wherein the capacitor dielectric layer includes a ferroelectric material having a Curie point $T_c$ of less than 300 K.

21. The integrated circuit of claim 1, wherein a relative dielectric constant $\in_{(T1)}$ of the capacitor dielectric layer at a temperature T1=400 K and a relative dielectric constant $\in_{(T2)}$ of the capacitor dielectric layer at the temperature T2=475 K satisfy $\in_{(T2)} \leq 0.75 \times \in_{(T1)}$.

22. The integrated circuit of claim 21, wherein:
the capacitor dielectric layer includes a paraelectric material; and
the paraelectric material includes at least one of $BaTiO_3$, $SrTiO_3$, $Ba_xSr_{1-x}TiO_3$ and $KTaO_3$.

23. The integrated circuit of claim 1, wherein:
the power transistor includes a plurality of power transistor cells arranged in a cell area of the semiconductor substrate; and
the auxiliary transistor is arranged in the cell area.

* * * * *